United States Patent
Kondo et al.

(10) Patent No.: US 8,542,433 B2
(45) Date of Patent: Sep. 24, 2013

(54) ELECTROMAGNETIC WAVE OSCILLATING DEVICES AND A METHOD OF PRODUCING THE SAME

(71) Applicant: NGK Insulators, Ltd., Aichi-prefecture (JP)

(72) Inventors: Jungo Kondo, Miyoshi (JP); Yuichi Iwata, Nagoya (JP); Tetsuya Ejiri, Kasugai (JP)

(73) Assignee: NGK Insulators, Ltd., Aichi-prefecture (JP)

( * ) Notice: Subject to any disclaimer, the term of this patent is extended or adjusted under 35 U.S.C. 154(b) by 0 days.

(21) Appl. No.: 13/718,511

(22) Filed: Dec. 18, 2012

(65) Prior Publication Data

US 2013/0156053 A1      Jun. 20, 2013

(30) Foreign Application Priority Data

Dec. 20, 2011     (JP) ................. 2011-278188

(51) Int. Cl.
  *G02F 1/35*    (2006.01)
  *G02F 2/02*    (2006.01)
  *H01S 5/06*    (2006.01)

(52) U.S. Cl.
  USPC .............. 359/326; 359/328; 372/21; 372/22

(58) Field of Classification Search
  USPC .............. 359/326–332; 372/21–22
  See application file for complete search history.

(56) References Cited

U.S. PATENT DOCUMENTS

| | | | |
|---|---|---|---|
| 5,007,694 A * | 4/1991 | Yamamoto et al. | 359/326 |
| 6,903,341 B2 * | 6/2005 | Imai et al. | 250/340 |
| 8,384,989 B2 * | 2/2013 | Kondo et al. | 359/330 |
| 2002/0024718 A1 | 2/2002 | Kawase et al. | |
| 2002/0117623 A1 | 8/2002 | Cole | |
| 2004/0072384 A1 | 4/2004 | Cole | |

FOREIGN PATENT DOCUMENTS

JP      09-146131 A      6/1997

(Continued)

OTHER PUBLICATIONS

Kanamori, M., et al., "Broadband antireflection gratings fabricated upon silicon substrates," Optics Lett. 1999;24 (20):1422-1423.
Miyakoshi, H., et al., "Polymeric Wide-band Wave Plate Produced via Nanoimprint Subwavelength Grating," Konica Minolta Technology Report, vol. 2, (2005), pp. 97-100.

(Continued)

*Primary Examiner* — Daniel Petkovsek
(74) *Attorney, Agent, or Firm* — Cermak Nakajima LLP; Tomoko Nakajima

(57) ABSTRACT

It is provided a device oscillating an electromagnetic wave having a target frequency of 0.1 THz to 30 THz. The device includes a main body made of a non-linear optical crystal and a sub-wavelength grating structure formed on the main body. The sub-wavelength grating structure includes protrusions arranged in first direction "X" and second direction "Y" on the main body, first grooves 3X each provided between the adjacent protrusions and extending in the first direction, and second grooves 3Y each provided between the adjacent protrusions and extending in the second direction. Each of the protrusions includes a pair of first faces opposing in the first direction "X" with each other and a pair of second faces opposing in the second direction "Y" with each other. The width of the first face is made smaller from the main body 7 toward an upper end 2c of the protrusion 2.

6 Claims, 14 Drawing Sheets

(4 of 14 Drawing Sheet(s) Filed in Color)

(56) References Cited

FOREIGN PATENT DOCUMENTS

| | | |
|---|---|---|
| JP | 2002-072269 A | 3/2002 |
| JP | 2002-287370 A | 10/2002 |
| JP | 2003-177210 A | 6/2003 |
| JP | 2004-521329 A | 7/2004 |
| JP | 2010-020120 A | 1/2010 |
| WO | WO2012/124829 A1 | 9/2012 |

OTHER PUBLICATIONS

"Challenge for production of high functional optical devices at low costs—Realization of sub-wavelength periodic structure by glass imprint method," Synthesiology, vol. 1, No. 1 (2008), pp. 24-30.
Concise Explanation under 37 C.F.R. 1.98(a)(3)(i) of Japanese language Non-Patent Literature documents.

* cited by examiner

Fig. 6
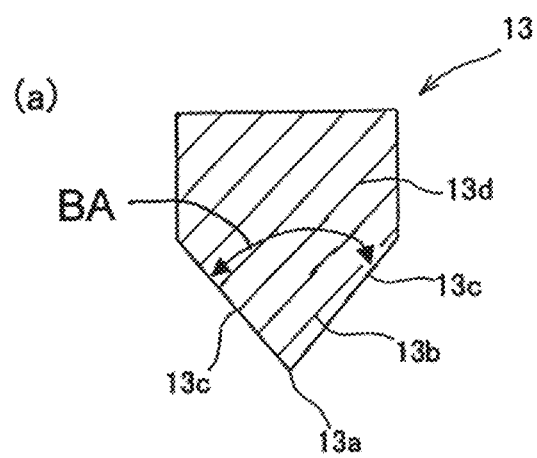
(a)
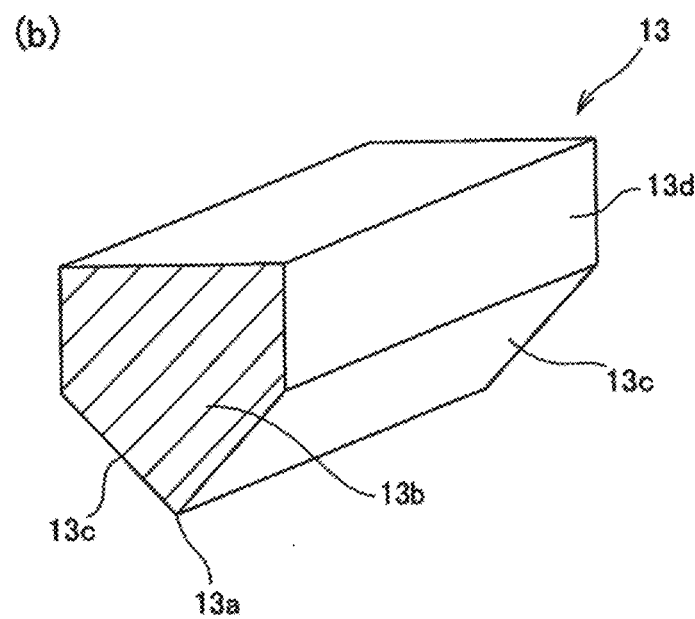
(b)

Fig. 10
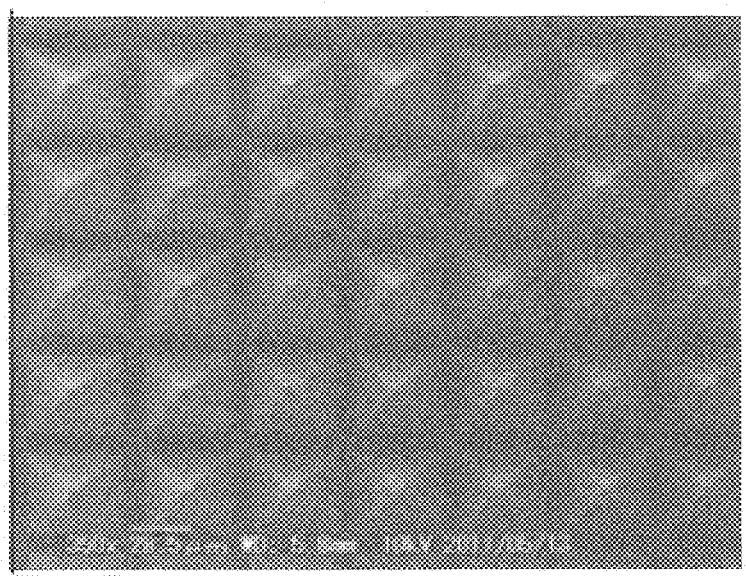
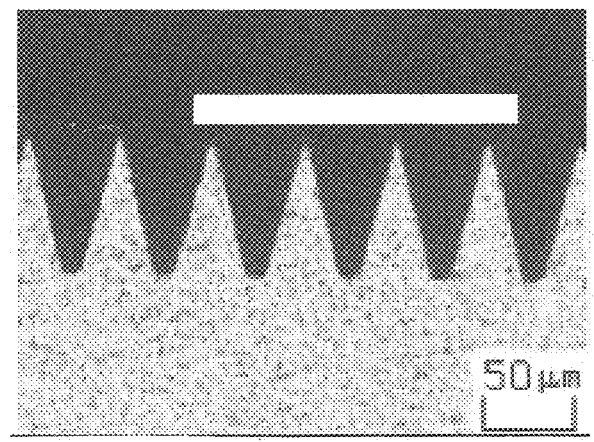
Depth of groove is 76.7 μm

Results of Calculation: Pyramidal shape
Transmittance (at a height of protrusion: 75 μm)

Results of Calculation: Pyramidal shape
Transmittance (at a height of protrusion: 100 μm)

ELECTROMAGNETIC WAVE OSCILLATING DEVICES AND A METHOD OF PRODUCING THE SAME

This application claims the benefit of Japanese Patent Application No. P2011-278188 filed on Dec. 20, 2011, the entirety of which is incorporated by reference.

TECHNICAL FIELD

The present invention relates to a device of oscillating so-called terahertz wave and a method of producing the same.

BACKGROUND ARTS

Terahertz waves are electromagnetic waves generally having a frequency of 0.1 THz to 10 THz, and are expected for basic fields such as physical properties, electrospectroscopy, bioscience, chemistry and pharmaceutical science and for applied fields of atmospheric environmental assessment, security, material test, food test and communication.

As a device for oscillating terahertz waves, it has been developed a backward wave oscillator (BWO) and photomixing in several hundreds GHz band and free electron energy laser, p-Ge laser and quantum cascade laser (QCL) for 1 THz or more. These devices, however, have problems in the miniaturization and improvement of output power.

On the other hand, it has been recently developed a device for oscillating a wide-band terahertz wave with an optical switch or rectification using a femtosecond laser as a light source and applied for time domain spectroscopy (TDS) or the like In addition to this, for generating terahertz wave using non-linear optical crystal such as $LiNbO_3$, it has been known methods of utilizing quasi phase matching (QPM) and of utilizing phonon polariton. Such methods are expected for applications requiring sources generating the terahertz wave having high temporal and spatial coherency.

It is described, in Japanese Patent Publication No. H9-146131A, device of generating terahertz wave using a y-plate or z-plate of an LiNbO3 substrate. That is, pump wave is irradiated onto the substrate from a light source, and at the same time, idler wave is irradiated onto the same substrate. The pump wave (frequency $\omega 1$), idler wave (frequency $\omega 2$) and polariton (terahertz wave: frequency $\omega T$) satisfy law of conservation of energy ($\omega 1 = \omega 2 + \omega T$) and law of conservation of momentum (noncollinear phase matching condition: $k1 = k2 + kth$), so that polariton stimulated scattering is observed. In this case, due to the scattering characteristics, the frequencies of the idler wave and terahertz wave are decided depending on the angles $\alpha$ and $\theta$ of the pump wave with respect to the optical axis.

According to the method, typically, the phase matching condition is satisfied when an angle $\alpha$ of wave vector k1 of the pump wave and wave vector k2 of the idler wave is 0.5° to 1° and the terahertz wave was then oscillated (wavelength of 100 to 300 μm, frequency of 3 THz to 1 THz) at a high efficiency. Further, it is described that the terahertz wave is oscillated at an angle of 65 to 66° with respect to the idler wave. In the case that a y-plate is used, the crystal orientation is different from that of the z-plate. As a result, the pump wave and idler wave propagate on a plane perpendicular to the substrate surface in an angle $\alpha$ to generate terahertz wave at an angle $\theta$ with respect to the pump wave.

However, (1) the crystal has a refractive index as high as 5.2 with respect to sub-milli wave (terahertz wave) so that total internal reflection occurs between the crystal and air. It is thus impossible to emit the terahertz wave into the air both in the cases of the y-plate and z-plate. (2) Optical loss in the crystal is large. For example, the optical intensity of the terahertz wave is reduced to about 0.1 percent with respect to a propagation distance of 3 mm of the terahertz wave. For these problems, according to Japanese Patent Publication No. H09-146131A, a grating is provided on a side face 5 of the substrate for emitting of the terahertz wave into the air at a high efficiency.

According to Japanese Patent Publication No. 2002-72269A, an exciting laser light having a single frequency is irradiated and an idler wave having a single frequency is used for optical injection to generate terahertz wave having a high output power and whose spectrum line width can be reduced. A silicon prism is, however, used for outputting the terahertz wave.

As described above, according to the prior devices, when terahertz wave is oscillated based on parametric oscillation, most of the generated wave is absorbed within a crystal. In addition to this, since the refractive index of the crystal is considerably higher than that of air, it is not possible to emit the generated terahertz wave to the outside of the crystal without providing a silicon prism or grating on a surface of the crystal. The intensity of the terahertz emitted to the outside of the crystal is too low for actual applications and it is required an additional step of providing the prism or grating on the surface of the crystal. Further, the provision of the prism or grating inevitably causes propagation and reflection losses due to them.

On the other hand, according to prior arts of generating visible and infrared rays, it has been tried to subject an optical device to fine processing to form a three-dimensional patterned structure having an interval or period smaller than a wavelength of the light on the surface of the optical device, so as to provide the function of preventing reflection on the surface (Japanese Patent publication No. 2002-287370A; Japanese Patent Publication No. 2004-521329A; Japanese Patent Publication, No. 2003-177210A; Japanese Patent Publication No. 2010-020120A; "OPTICS LETTERS" Vol. 24, No. 20, October 15, page 1422 (Optical Society of America); [KONICA MINOLTA TECHNOLOGY REPORT] Vol. 2 (2005), pages 97 to 100 "Polymeric Wide-band Wave Plate Produced via Nanoimprint Subwavelength Grating"; "Synthesiology", Vol. 1, No. 1 (2008), pages 24 to 30, "Challenge for production of high functional optical devices at low costs - - - Realization of sub-wavelength periodic structure by glass imprint method").

SUMMARY OF THE INVENTION

Besides, the assignee disclosed a device of generating terahertz wave using a specific shape of a subwavelength grating (Japanese Patent Application No. 2011-058991 (WO 2012/124829).

The inventors have paid attention to the subwavelength grating structure as described in the above documents and tried to apply such structure for preventing the reflection of the generated terahertz wave. Such study has not been made yet. As the inventors have actually studied and produce the structure, however, they have found various kinds of problems so that the structure has difficulty in the application.

That is, for example according to the descriptions in Japanese Patent Publication No. 2010-020120A, a depth of roughness of the surface of the device is indicated as following formula.

$$d = \lambda / (4\sqrt{n} \times no)$$

(λ represents a wavelength of light, n represents a refractive index of a crystal forming the device, and no represent a refractive index of air and equal to 1.)

For example, it is thus required that the depth is 32.8 µm or more, in the case that the frequency of the light is 1 THz, λ is 300 µm and n is 5.2 which is a refractive index of lithium niobate single crystal. According to Japanese Patent Publication No. 2010-020120A, such three-dimensional gratings are formed by nanoimprint technique or reactive ion etching or wet etching (nitric-hydrofluoric acid for LiNbO3 system) based on semiconductor processing. Lithium niobate or lithium tantalate single crystal is, however, difficult to process so that it is difficult to form fine roughness having a depth of 30 µm or more.

Concerning this problem, in WO 2012/124829, the inventors disclosed the followings. That is, many protrusions each having a Square pyramidal shape as shown in FIG. 12 are regularly formed on a surface of a substrate 7 to provide a subwavelength grating, and terahertz wave is irradiated onto the subwavelength grating from the inside of the substrate 7 as shown an arrow A so that the terahertz wave is emitted to the outside of the substrate. At the same time, simulation was made in the cases that the height of the square pyramidal protrusions is changed in a range of 25 to 300 µm to calculate a transmittance of the terahertz wave emitted from the substrate to the outside.

As a result, in typical condition with the height of the square pyramidal protrusion being made 75 µm, it was proved that a sufficiently high transmittance could not be obtained over a wide frequency range (refer to FIG. 13). In this case, when the height of the protrusion is 100 µm, for example, a sufficiently high transmittance could be obtained over a wide frequency range (refer to FIG. 14). A substantial difference was not observed in the cases that the height of the protrusion is 300 µm and 100 µm.

As described above, however, it is difficult to form many protrusions each having a height of 100 µm at a predetermined interval by processing a non-linear optical crystal with an extremely high hardness such as lithium niobate. In addition to this, it is difficult to form such protrusions having a designed shape with a specific precision. It is thus very difficult to form a sub-wavelength grating having a high transmittance with respect to light having a wavelength in terahertz range.

An object of the present invention is utilize a sub-wavelength grating structure to provide a device capable of emitting terahertz wave from a crystal of a high refractive index such as lithium niobate to the outside of the device at a high efficiency.

The present invention provides a device comprising a non-linear optical crystal, said device oscillating an electromagnetic wave having a target frequency of 0.1 THz to 30 THz from the crystal to the outside of the crystal.

The device includes a main body comprising the non-linear optical crystal and a sub-wavelength grating structure formed on the main body. The sub-wavelength grating structure includes protrusions arranged in first and second directions on the main body, first grooves each provided between the adjacent protrusions and extending in the first direction, and second grooves each provided between the adjacent protrusions and extending in the second direction. Each of the protrusions includes a pair of first faces opposing in the first direction with each other and a pair of second faces opposing in the second direction with each other. The width of the first face is made smaller from the main body toward an upper end of the protrusion, the width of the second face is made smaller from the main body toward an upper end of the protrusion, the first groove forms a curved line in a cross section cut along the width direction, and the second groove forms a curved line in a cross section cut along the width direction.

According to the inventive device, it is possible to provide a device capable of emitting terahertz wave from the crystal with a high refractive index such as lithium niobate to the outside of the crystal, by applying the sub-wavelength grating structure described above. Specifically, in the case that many protrusions each having pyramidal shape, for example, are regularly formed, it is possible to obtain a high peak transmittance by forming the grooves between the adjacent protrusions so that the groove form a curved concave face viewed in a cross section in the width direction of the groove. It is proved that such effect is considerable compared with the case that many protrusions each having pyramidal shape are formed, for example as shown in FIG. 12.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIGS. 6(a) and (b) are views showing shape of outer turning blade used for forming a sub-wavelength grating.

FIG. 10 is a photograph showing an upper face and cross section of the device 1 produced according to the Inventive Example 1.

EMBODIMENTS OF THE INVENTION

A sub-wavelength grating (SWG) structure means a fine periodic structure whose period is not higher than a diffraction limit of light having a specific wavelength. In the ease that the light is made incident into the structure, the light can not recognize the fine periodic structure so that the light behaves in the structure as if the structure is composed of an uniform medium whose refractive index would be an average value of substances forming the periodic fine structure. Specifically, it is known "moth-eye" structure having anti-reflection effect.

Figure 12:
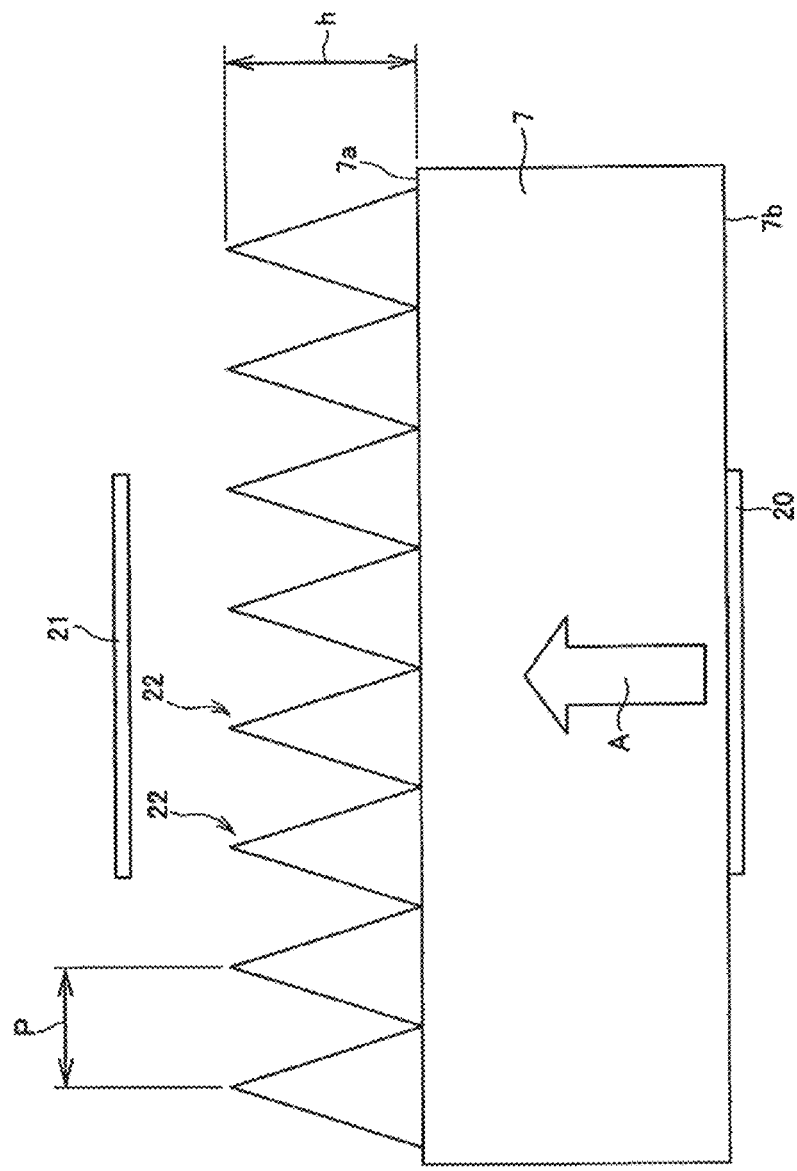
FIG. 12 is a diagram schematically showing a sub-wavelength grating according to Comparative Example.
Figure 13:
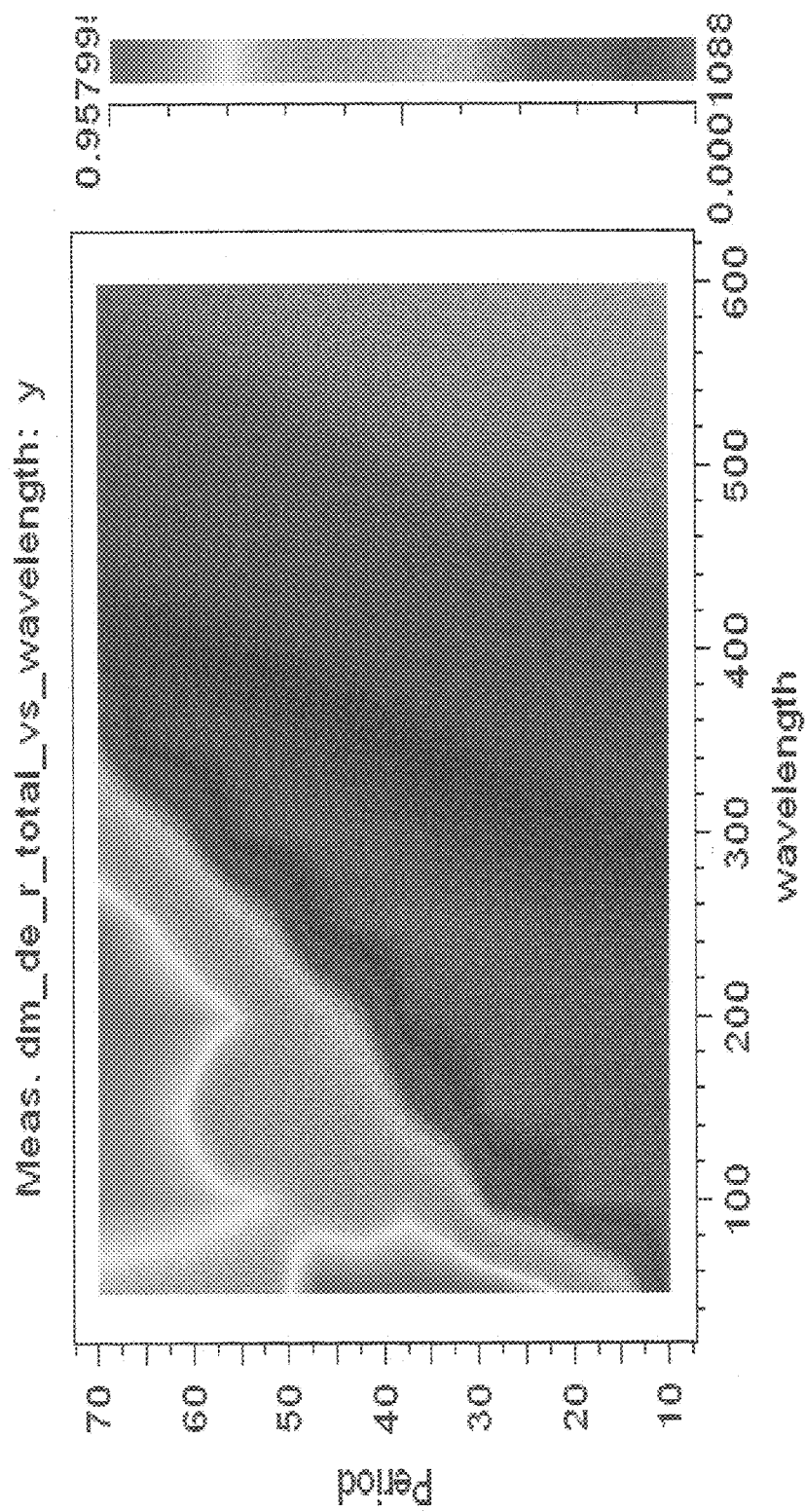
FIG. 13 shows results of simulation of transmittance of a sub-wavelength grating according to the Comparative Example.
Figure 14:
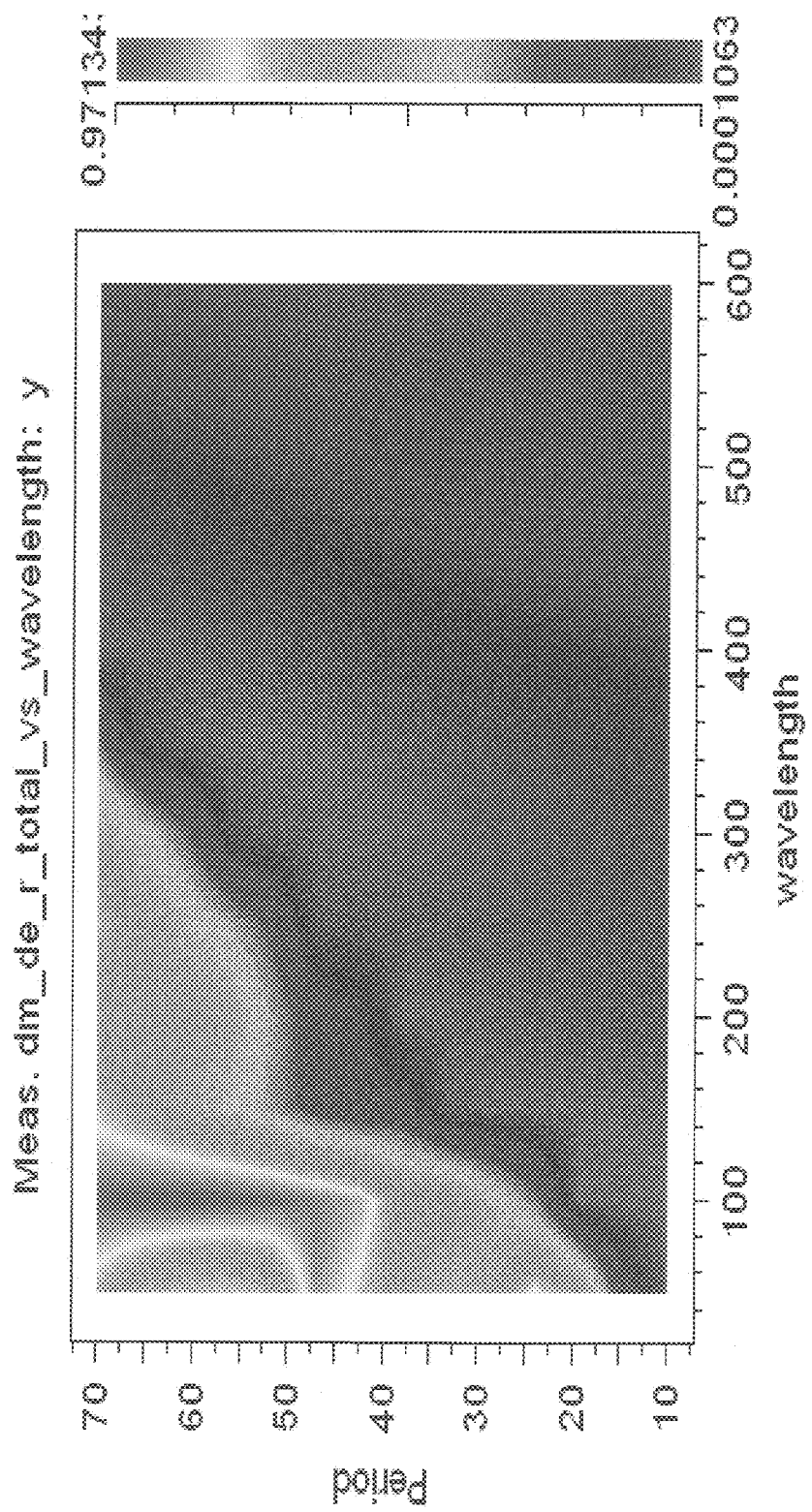
FIG. 14 shows results of simulation of transmittance of another sub-wavelength grating according to Comparative Example.

For example, according to a device of a comparative embodiment shown in FIG. 12, a sub-wavelength grating structure is formed on a face of a main body 7 made of a non-linear optical crystal. The sub-wavelength grating structure is composed of many protrusions 22, each having pyramidal shape, periodically formed in vertically and horizontally at predetermined intervals. The protrusion 22 may be formed of pillars in stead of the pyramidal shape.

According to the inventors' study, however, it is difficult to form such protrusions each having a large depth on a non-linear optical crystal. It is thus difficult to produce the sub-wavelength grating structure, preventing the reflection of the terahertz wave, in a large scale. It is further proved that it is difficult to improve the transmittance of the light having a target wavelength beyond a some degree by such protrusions having the shape described above.

Figure 1:
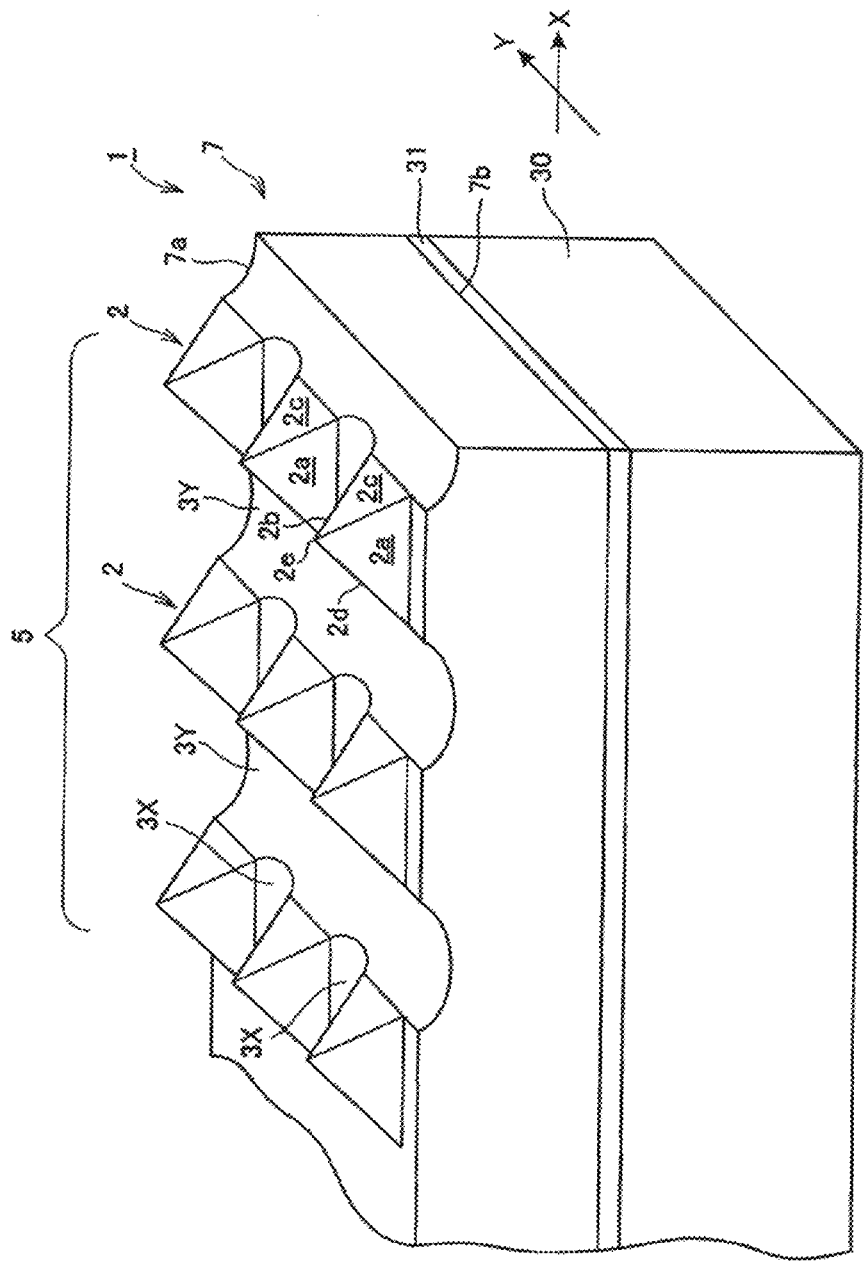
FIG. 1 is a perspective view schematically showing a device 1 according to an embodiment of the present invention.
Figure 2:
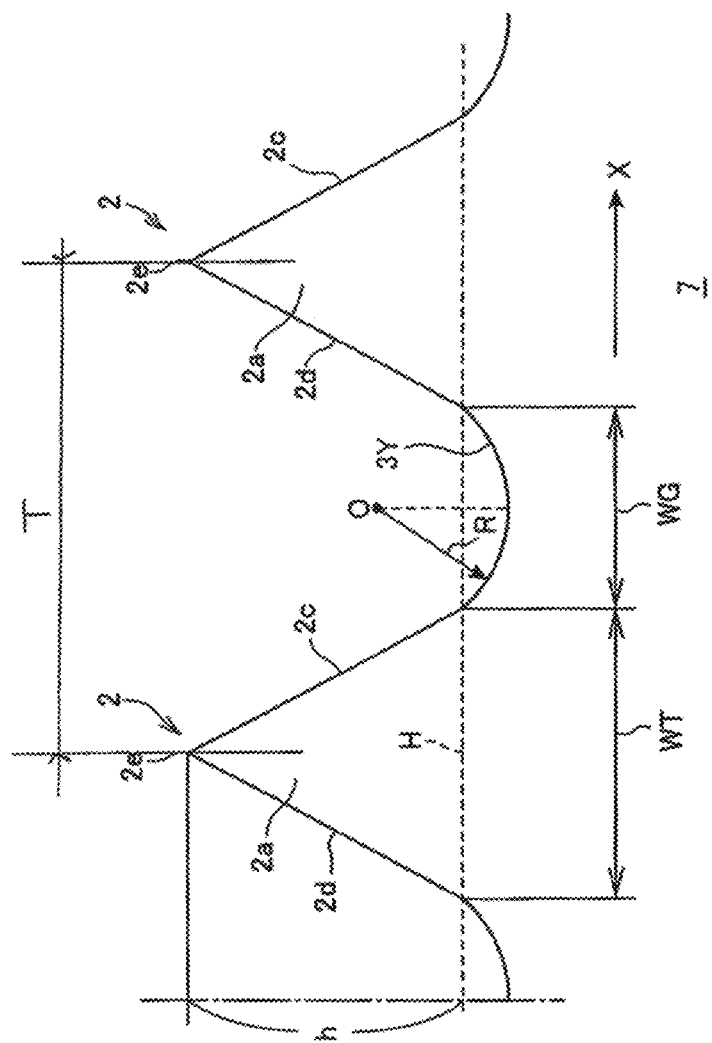
FIG. 2 is an enlarged view showing shapes of a protrusion 2 and second groove 3Y of the device 1 shown in FIG. 1.
Figure 3:
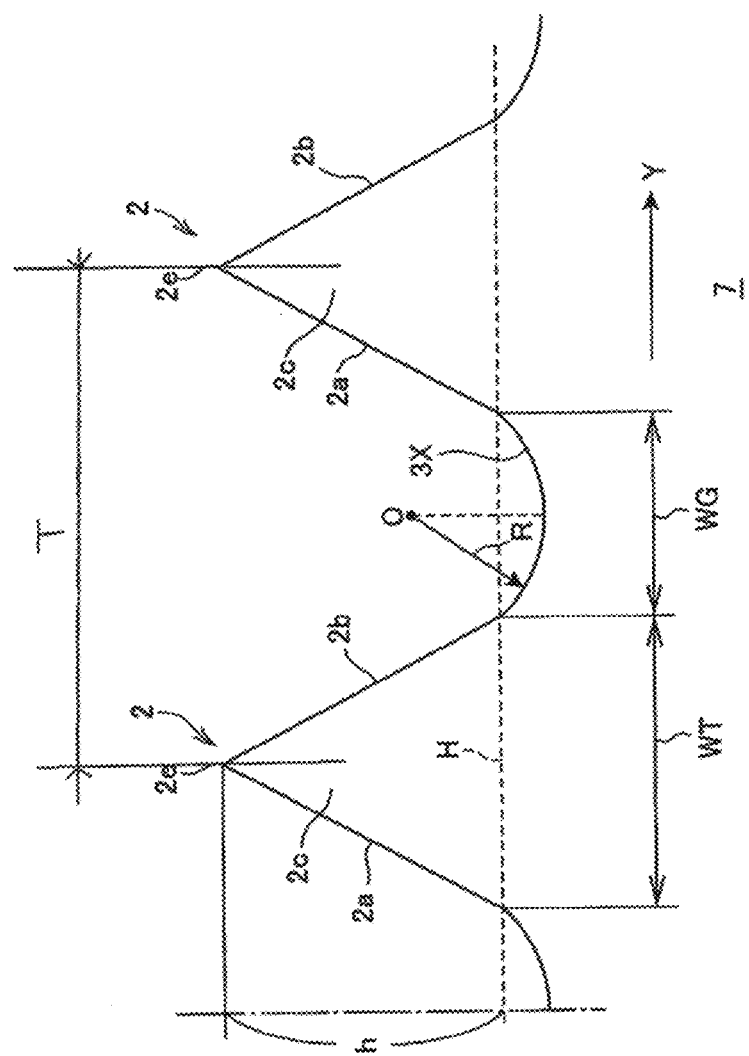
FIG. 3 is an enlarged view showing shapes of the protrusion 2 and first groove 3X of the device 1 shown in FIG. 1.

FIGS. 1, 2 and 3 show a device 1 according to an embodiment of the present invention. FIG. 1 is a perspective view showing the device 1, FIG. 2 is an enlarged view showing the device 1 viewed in "X" direction, and FIG. 3 is an enlarged view showing the device 1 viewed in "Y" direction.

According to the device, a bottom face 7b of a main body 7 made of a non-linear optical crystal is adhered to a supporting body 30 through an adhesive layer 31. An upper face of the main body 7 functions as a face 7a emitting electromagnetic wave. A sub-wavelength grating structure 5 is formed on the side of the emitting face 7a of the main body 7, so as to assist the emission of the electromagnetic wave from the inside to the outside of the crystal and to reduce the reflection of the electromagnetic wave on the crystal surface.

The sub-wavelength grating structure 5 of the present example includes protrusions arranged periodically in the "X" and "Y" directions, respectively. Each protrusion 2 has pyramidal shape. That is, the protrusions are periodically arranged in the "X" direction and "Y" direction, respectively. Each pyramidal-shaped protrusion includes a pair of faces 2c and 2d periodically arranged and opposed with each other in the "X" direction and another pair of faces 2a and 2b periodically arranged and opposed with each other in the "Y" direction. According to the present example, each of the faces 2a to 2d forms a flat face. Each protrusion includes a top point 2e at its upper end.

Further, according to the present example, first grooves 3X each extending in the "X" direction and grooves 3Y each extending in the "Y" direction are formed. Then, the adjacent protrusions are separated by the grooves 3X and 3Y, respectively.

Each of the grooves 3Y (FIG. 2) and 3X (FIG. 3) forms a curved profile with respect to a horizontal line "H" before the processing of the main body 7. Therefore, as shown in FIGS. 2 and 3, the bottom face of the groove forms a curved profile, provided that each groove is cut in the width direction (in the direction perpendicular to the longitudinal direction) of the groove.

According to the sub-wavelength grating structure of the present example, by applying the structure each having the shape described above, it was found that the transmittance can be improved compared with the case many protrusions having the pyramidal shape are arranged as shown in FIG. 12, even when the height "h" of the protrusions is the same. In addition to this, such structure can be formed efficiently by a process, for example, as described later.

The inventors further tried, in a structure including many protrusions with pyramidal shape periodically arranged in two dimensions, to form a flat face between the adjacent protrusions. It was, however, found that the transmittance can be further improved by providing the curved groove between the adjacent protrusions as described above, with respect to the case that the flat faces are formed between the adjacent protrusions. The present invention is based on the discovery.

The device of the present invention can transmit a electromagnetic wave having a target frequency in a range of 0.1 to 30 THz to the outside of the crystal. The dimensions of the inventive sub-wavelength grating structure is to be adjusted so that the transmittance can be made the maximum with respect to the electromagnetic wave having the target frequency. It is thus not necessary that the sub-wavelength grating structure exhibits a high transmittance over the whole range of 0.1 to 30 THz.

The non-linear optical crystal forming the main body is not limited as far as it is capable of oscillating terahertz wave by parametric effect, and the crystal includes a dielectric material such as lithium niobate, lithium tantalate, solid solution of lithium niobate and lithium tantalate, KTP and KN. Further, the crystal may be doped with magnesium oxide or the like for preventing optical damage. Further, the lithium niobate may be of congruent composition as well as stoichiometric composition.

The two directions "X" and "Y" for arranging the protrusions intersect each other at an angle, which may preferably be 85 to 95° and most preferably be right angle.

Further, each protrusion includes a pair of first faces opposing with each other in the "X" direction and another pair of second faces opposing with each other in the "Y" direction. Each of the faces may be flat as shown in FIG. 1, or concave face with respect to the flat face, or convex face with respect to the flat face. Further, the top end of each protrusion may form the top point as shown in FIG. 1 or may form a flat face. Further, chamfered face, C-face or R-face may be formed at the top end of the protrusion.

Figure 4:
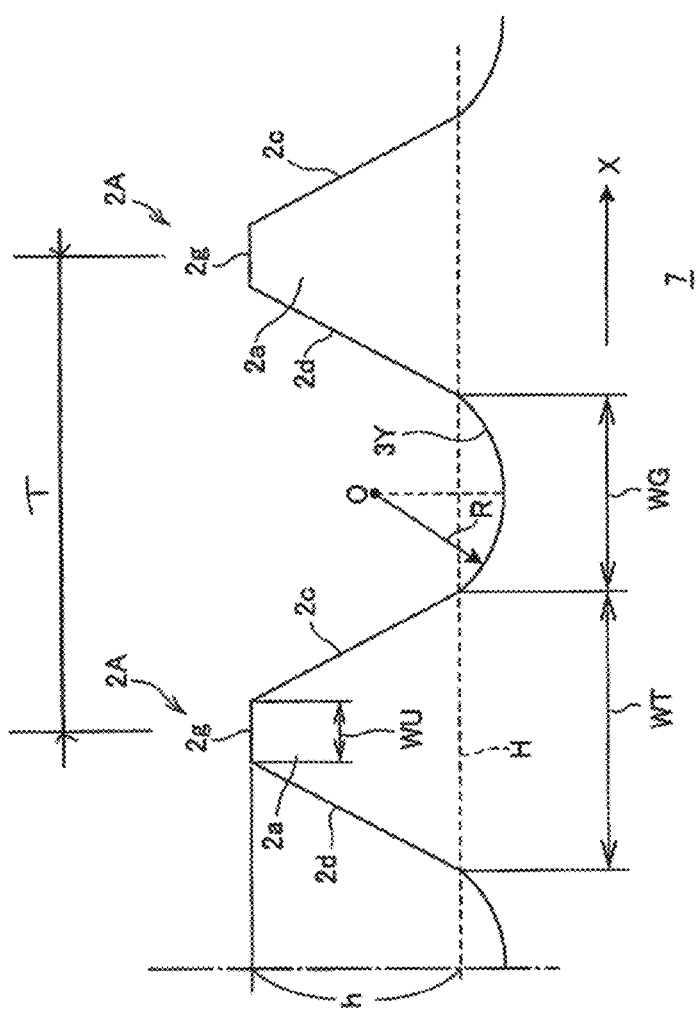
FIG. 4 is an enlarged view showing shapes of the protrusion 2A and groove 3Y of a device according to another embodiment.

For example in the example shown in FIG. 4, each of the first faces 2c and 2d and second faces 2a and 2b of each protrusion 2A are flat, and the top end of each protrusion 2A does not form a point but form a flat face 2g. The flat face 2g may be a convex face or so-called chamfered face, C-face or R-face.

Figure 5:
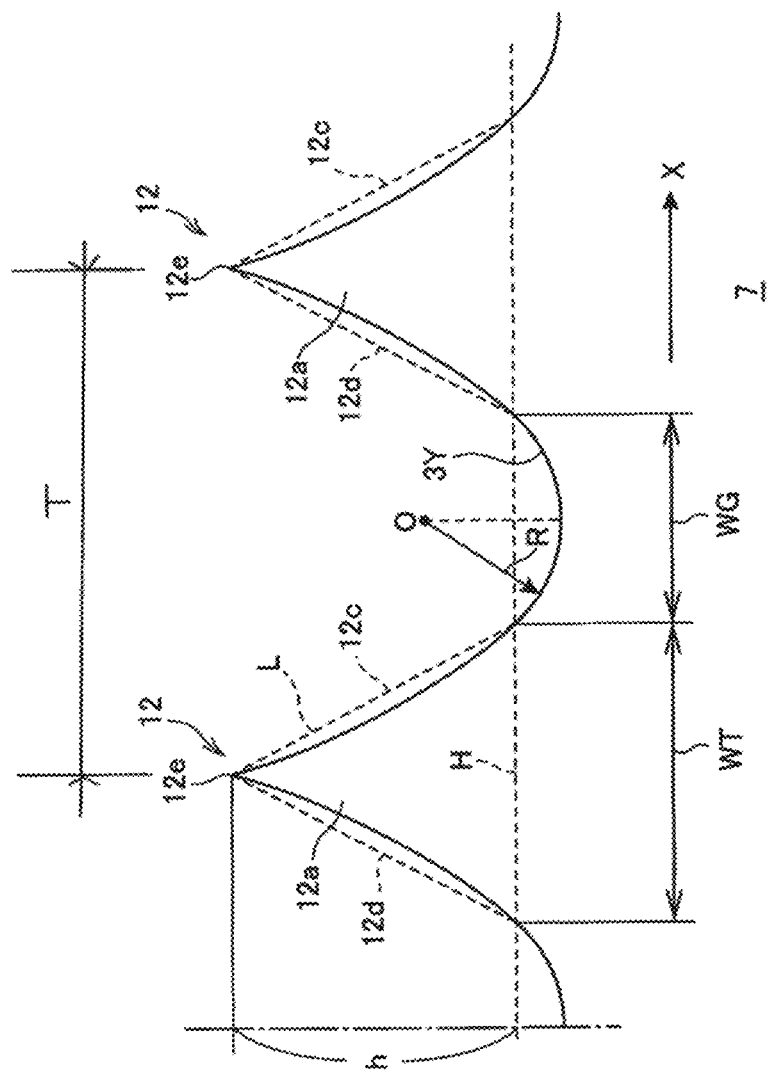
FIG. 5 is an enlarged view showing shapes of the protrusion 12 and groove 3Y of a device according to still another embodiment.
Figure 7:
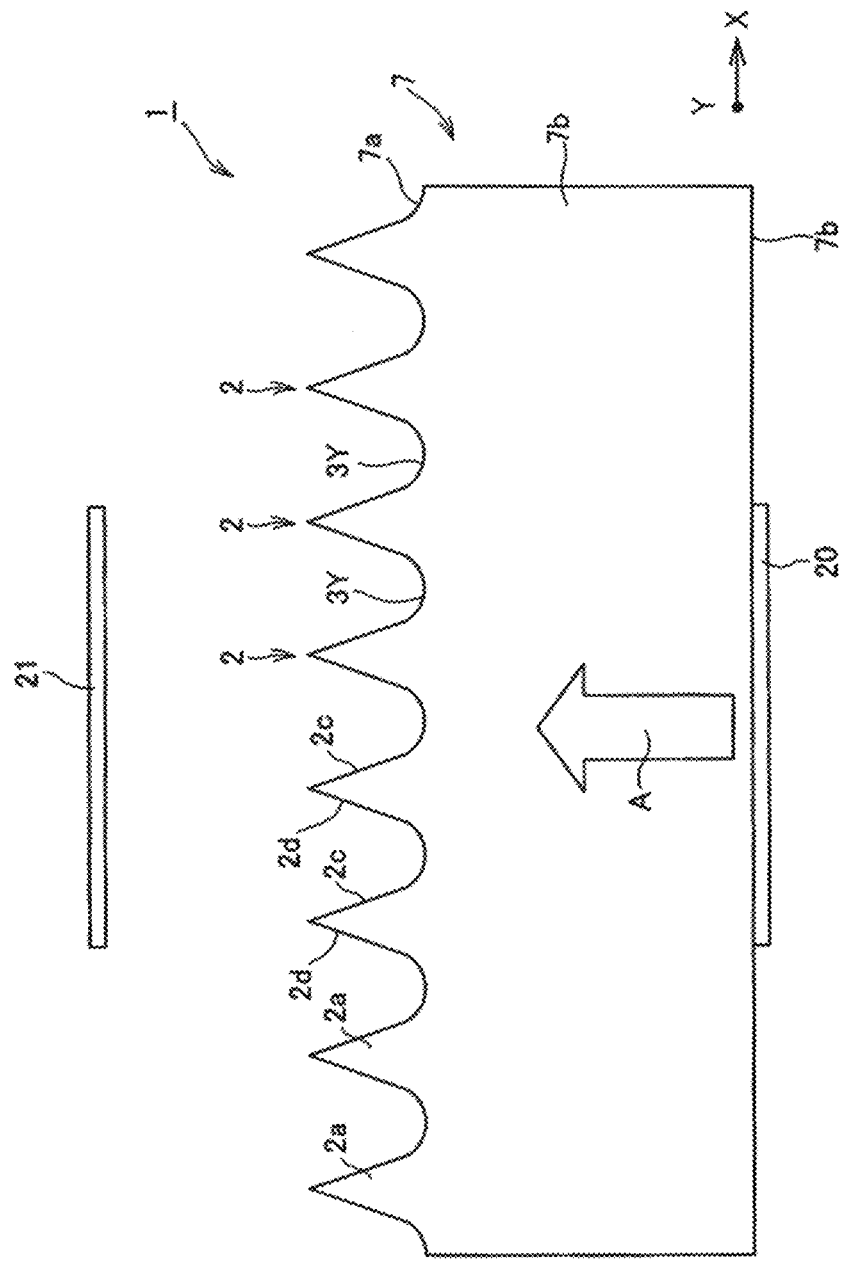
FIG. 7 is a front view schematically showing the device 1 according to an embodiment of the present invention.

Further, as shown in FIG. 5, each protrusion 2 includes faces 12a, 12b, 12c and 12d, each of which is concave with respect to an imaginary line "L" corresponding to a flat face, to form a concaved face.

Here, on the viewpoint of the present invention, although the height "h" of each protrusion is to be decided upon the target frequency and thus is not limited, the height may preferably be larger on the viewpoint of transmittance. On the viewpoint, "h" may preferably be 30 µm or larger, more preferably be 40 µm or larger and most preferably be 50 µm or larger. Further, on the viewpoint of ease of the processing, the height "h" is preferably smaller. On the viewpoint, the height "h" may preferably be 300 µm or smaller and more preferably be 100 µm or smaller.

The pitch (period) "T" and width "WT" of each protrusion is to be selected depending on the target frequency. Here, "T" means a distance of center lines of the adjacent protrusions viewed in the "X" and/or "Y" direction(s). As shown in FIGS. 2, 3 and 5, in the case that the protrusion includes the top point 2e or 12e, "T" corresponds with a distance between the top points of the adjacent protrusions. Further, as shown in FIG. 4, in the case that the protrusion includes the top face 2g, "T" corresponds with a distance between center lines of the top faces of the adjacent protrusions. The pitch (period) "T" may preferably be 15 to 70 µm on the viewpoint of the transmittance and the ease of the processing. Further, the width "WT" may preferably be 10 to 55 μm, more preferably be 20 to 50 μm and most preferably be 25 to 40 μm, on the viewpoint of the transmittance and ease of the processing.

The grooves 3X extending in the "X" direction and grooves 3Y extending in the "Y" direction form curved faces, respectively. The bottom face of each groove is shown as a curved line (curved profile) viewed in the cross section of the groove. The center "O" of curvature of the curved line is present over the groove (over the curved line). The radius "R" of curvature of the curved line may preferably be 5 μm or more on the viewpoint of transmittance. Further, the radius "R" of curvature may preferably be 30 μm or less and more preferably 20 μm or less, on the viewpoint of transmittance. Further, the curved line forming the bottom face of the groove may have two or more centers of curvature. Even in this case, each of the radiuses of curvature of the curved line may preferably be 5 μm or larger.

Besides, the height and width of the protrusion and width of the groove are measured with respect to a horizontal line before processing the surface of the main body.

For example, as shown in FIG. 4, in the case that a flat face is formed at the top end of the protrusion, a ratio "WU/WT" of a width "WU" of the flat face with respect to the width "WT" of the protrusion may preferably be 0.5 or lower and more preferably be 0.2 or lower, on the viewpoint of transmittance.

For example, as shown in FIG. 5, in the case that each face forming each protrusion is a concave face, the center of curvature of the concave face forming the protrusion is out of the protrusion. In this case, the radius of curvature of the concave face may preferably be 20 μm or more and more preferably be 25 μm or more. Further, each of the concave face may have two or more centers of curvature. The upper limit of the radius of curvature is not particularly limited, and most preferably, each face is a flat face.

According to a preferred embodiment, when the adjacent protrusions and intervened groove are viewed in a cross section cut in the direction "X" or "Y" of the arrangement, the foot of the profile of the protrusion and the profile of the groove are made continuous with each other. Alternatively, a step may be formed between the foot of the profile of the protrusion and the profile of the groove.

According to the present invention, the width of the first face is made smaller from the main body 7 toward the top end 2e of the protrusion, and the width of the second face is made smaller from the main body 7 toward the top end 2e of the protrusion. Although the width of each face may be preferably made smaller linearly or gradually as shown in FIGS. 1 to 5, the width may be made smaller stepwise.

According to the present invention, a source of generating an electromagnetic wave is provided outside of the device, the electromagnetic wave generated from the source is made incident into the device, and the electromagnetic wave is then emitted from a emitting face for the electromagnetic wave of the device main body. Alternatively, the electromagnetic wave may be generated within the device based on parametric oscillation.

In the case of the parametric oscillation, a pump wave is made incident into the main body of the device made of a non-linear optical crystal capable of parametric oscillation, so that the idler and terahertz waves are generated in directions satisfying noncollinear phase matching condition. At this stage, a first laser light having a single frequency as the pump wave may preferably be used and a separate second laser light having a single frequency may preferably be injected in the direction of the generation of the idler wave.

For example, the pump wave is irradiated from a light source and the idler wave is irradiated from a light source, respectively, onto the device main body. Among the pump wave (frequency $\omega1$), idler wave (frequency $\omega2$) and polariton (terahertz wave: frequency $\omega T$), law of conservation of energy ($\omega1=\omega2+\omega T$) and law of conservation of momentum (Noncolliner phase matching condition: $k1=k2+kth$) are satisfied so that polariton stimulated scattering is observed. In this case, based on the scattering property, the wavelengths of the idler wave and terahertz wave are decided depending on angles $\alpha$ and $\theta$ of the pump wave with respect to the optical axis.

The frequencies of the pump, idler and terahertz waves, $\alpha$ and $\theta$ are decided by the parametric oscillating condition. Typically, the wavelength of the pump wave may preferably be 800 nm to 1600 nm, and $\alpha$ may preferably be 0.04° to 4°. In this case, $\theta$ is in a range of 65 to 62°

Although the material of the supporting body is not particularly limited, a dielectric material such as lithium niobate, lithium tantalate, solid solution of lithium niobate and lithium tantalate, KTP and KN, a semiconductor such as GaP and ZnSe, and a glass such as quartz glass are listed.

Further, on the viewpoint of improving the reliability and matching of thermal expansion with that of the device main body, the supporting body may preferably be made of the same material as the main body.

The adhesive adhering the device main body and supporting body is preferably made of a material having a dielectric constant lower than that of the main body. Specifically, the refractive index of the adhesive may preferably be 2 or lower. Although the specific examples of the adhesive is not particularly limited, an epoxy series resin adhesive, an acrylic type resin adhesive, a Cardo polymer type resin adhesive, a room-temperature curable type resin adhesive, a thermosetting type resin adhesive, ultraviolet curable type resin adhesive, and Alan Ceramics C (Trade Name, supplied by Toa Gosei Co. LTD.) (thermal expansion coefficient of $13 \times 10^{-6}$/K) may be listed.

Although the thickness of the adhesive layer is not particularly limited, the thickness may preferably be 0.5 μm or larger on the viewpoint of preventing the leakage of the terahertz wave.

The light sources for the pump and idler waves may preferably be a semiconductor laser or a solid laser excited by the semiconductor laser (YAG, $YVO_4$, YLF or the like). Such semiconductor laser or solid laser light source may be connected to the crystal directly with a butt joint or a lens. Further, the light source may be guided with an optical fiber whose end face may be connected with the crystal directly with a butt joint or a lens.

It is possible to form the sub-wavelength grating structure of the present invention on the surface of the device main body, by grinding the surface applying a peripheral cutting blade (edge). The process may preferably be carried out according to the following procedure. First, it is selected a peripheral cutting blade for cutting out the predetermined shape described above. Then, the shape of the blade is finished (dressing). Then, a height of the blade is adjusted at the surface of the main body (blade height zero-point adjustment). Then, the height and feed pitch of the blade are adjusted so that desired depth of groove, dimensions of the protrusions and first and second faces are obtained. Then, the rotational speed and feed speed of the blade and an amount of cut water are set. Then, the face of the main body is processed with the blade in the "X" and "Y" directions to form the grooves.

As such peripheral cutting blade, it may be used a peripheral cutting blade 13 as shown in FIGS. 6(a) and (b), for example. The blade 13 includes a main body 13d, protruding grinding section 13b, a pair of grinding faces 13c and a top section 13a with an angle "BA" of the protruding grinding section (blade angle). It is possible to control the shapes of the faces of the protrusion and the groove, by adjusting the shapes of the grinding face and top section in consideration of a hardness of the processed material and feed speed of the peripheral cutting blade. The blade angle "BA" may preferably be 10 to 30°.

EXAMPLES

Inventive Example 1

The device of emitting electromagnetic wave having the shape as shown in FIGS. 1, 2, 3 and 7 was produced. However, the supporting body and adhesive layer shown in FIG. 1 were not provided in its sub-wavelength grating structure 5.

Specifically, it was prepared a main body 7 made of y-cut Mg-doped lithium niobate single crystal. The main body 7 had a length of 30 mm, a width of 30 mm and a thickness of 0.5 mm. A dicing saw was used so that the peripheral cutting blade 13 shown in FIG. 6 was moved in the "X" direction and then moved in the "Y" direction to perform the grinding of the main body to form the protrusions 2. The peripheral cutting blade 13 was of Electroformed Bond Blades type and had a width of 200 μm and a blade angle "BA" of 28°, with grinding stones of #4000. The processing was carried out under the conditions of a rotational speed of 30000 rpm and a feed speed of 0.5 mm/s to form the groove having a depth of 30 to 300 μm, while the feed speed of the blade was controlled to attain a predetermined pitch.

The dimension of each section was shown below.

| | |
|---|---|
| "h" | 75 μm |
| "WT" | 37 μm |
| "WG" | 12.6 μm |
| "R" | 7.4 μm |
| "T" | 50 μm |

TDS measurement was performed for measuring transmittance characteristics for terahertz wave. That is, a light source 20 for oscillating terahertz wave was fitted to the bottom face 7b of the device main body 7 and the terahertz wave was made incident into the inside of the device main body as an arrow "A". Then, a receiving device 21 was set in air over the sub-wavelength grating structure 5 to measure the receiving intensity of the terahertz wave. The transmittance is defined as a ratio of the receiving intensity with respect to oscillation intensity. As a result, the peak transmittance was proved to be 99 percent or more.

Figure 8:
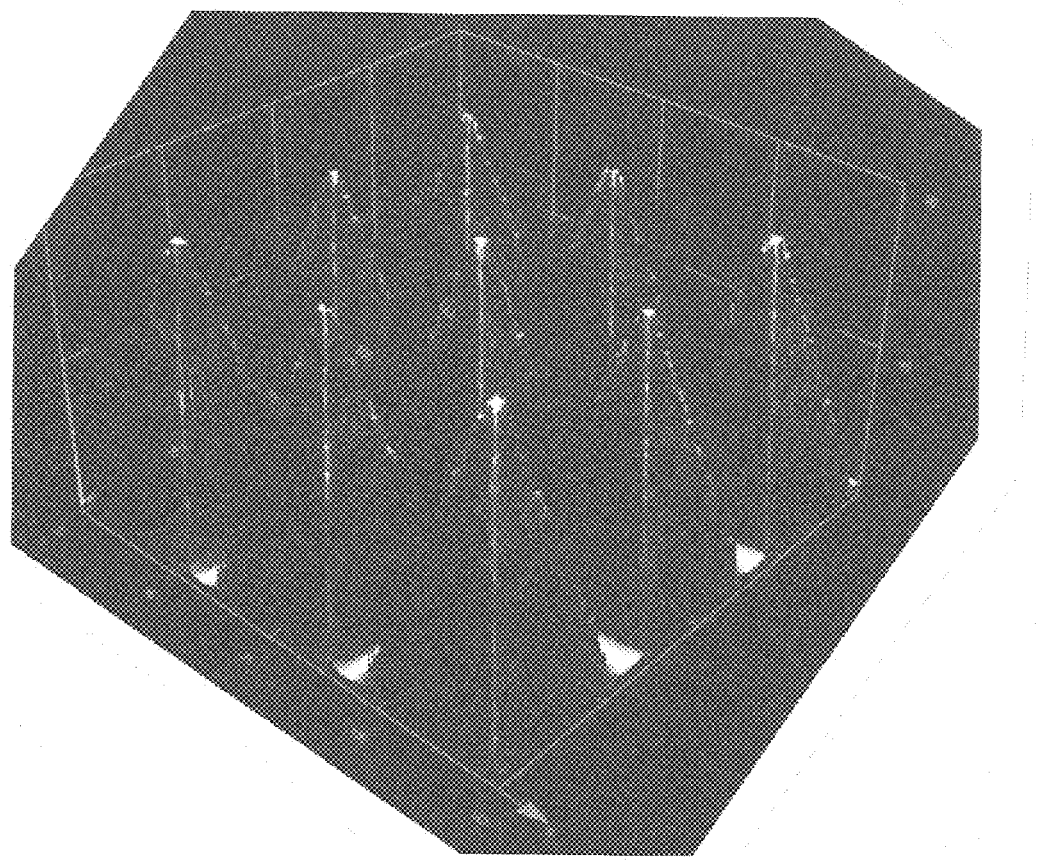
FIG. 8 is a 3D diagram showing the device 1 produced according to the Inventive Example 1.
Figure 9:
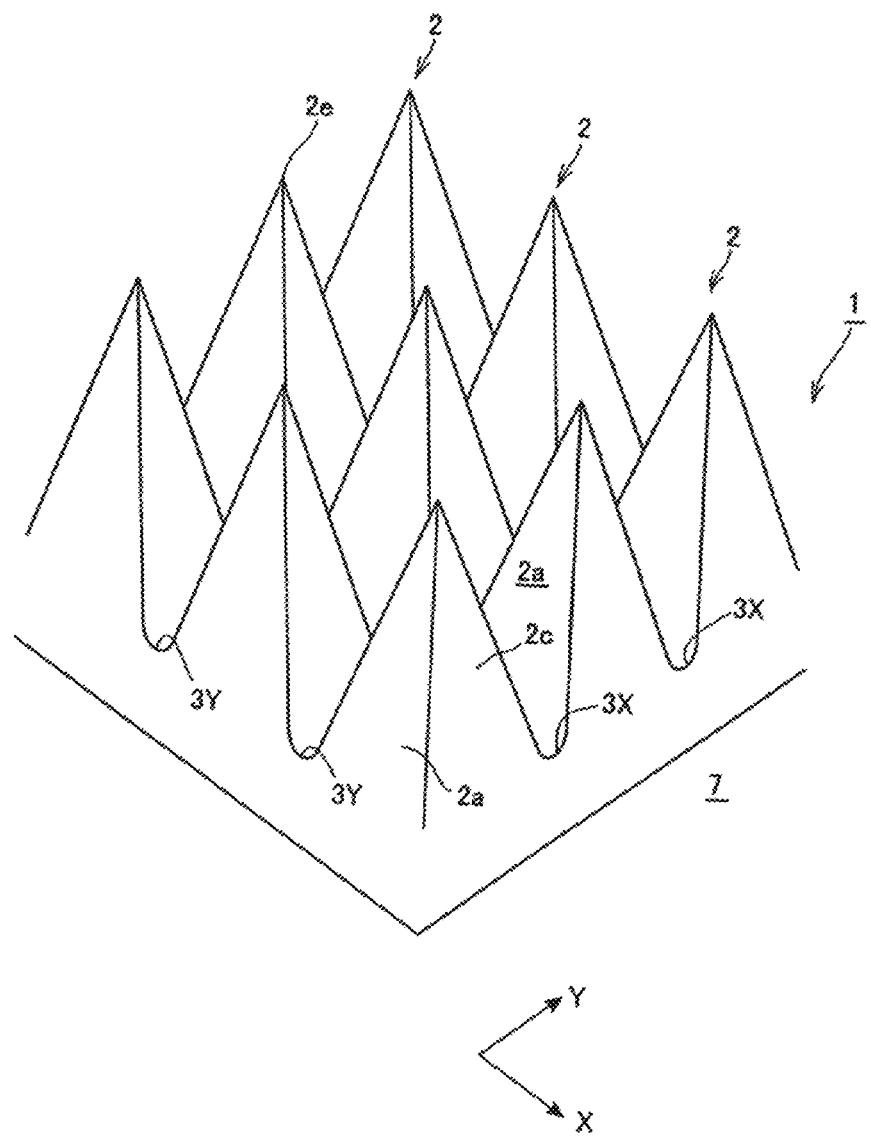
FIG. 9 is a perspective view showing the device 1 produced according to the Inventive Example 1.
Figure 11:
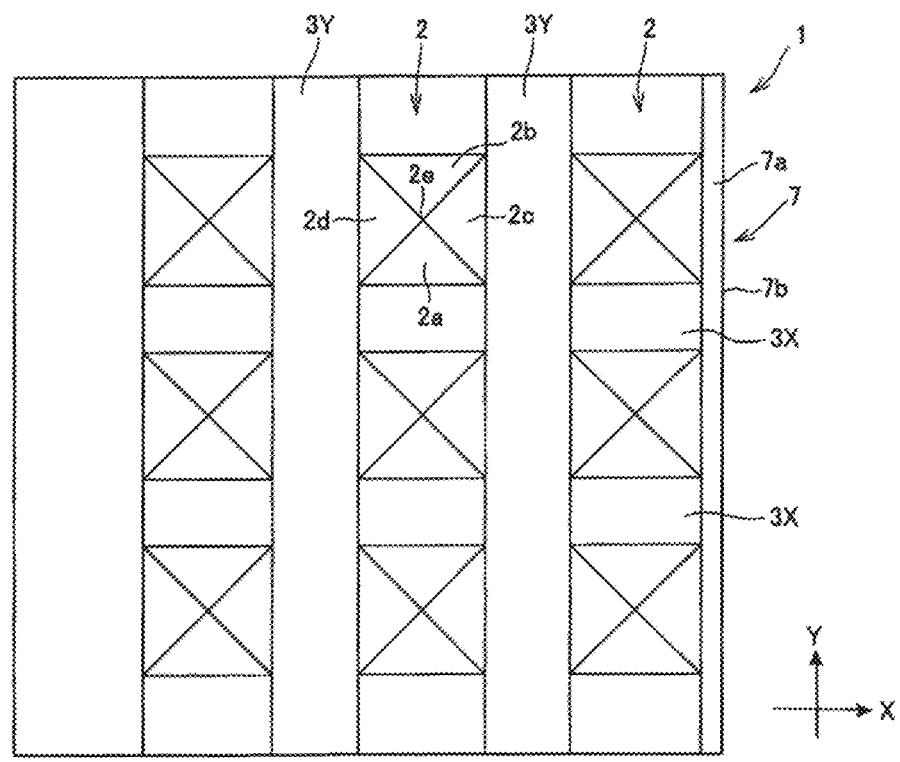
FIG. 11 is a plan view schematically showing the device 1 produced according to the Inventive Example 1.

Besides, 3-dimensional image of the thus obtained sub-wavelength grating structure was measured by means of a laser microscope "LEXT" supplied by Olympus corporation and shown in FIG. 8. Further, the 3-dimensional image was converted to a perspective view, which was shown in FIG. 9. Further, an image of the top face of the thus obtained sub-wavelength grating structure was measured by means of an electron microscope "VE-7800" supplied by KEYENCE, and the thus obtained image was shown in FIG. 10. Further, the image of FIG. 10 was converted to a plan view schematically showing the image, as in FIG. 11. As can be seen from the above results, it was successfully obtained the grating structure substantially in conformity with the intended design.

Comparative Example 1

The device main body 7 used in the Inventive Example 1 was used to measure the transmittance of the emitted electromagnetic wave, except that the sub-wavelength grating structure was not formed on the surface of the device main body. In this case, the peak transmittance was 55 percent and did not substantially depend on frequency of the wave. This result corresponds with the fact that lithium niobate single crystal has a refractive index of 5 in the frequency range.

Comparative Example 2

A sub-wavelength grating structure composed of protrusions each having pyramidal shape shown in FIG. 12 was subjected to two-dimensional analysis according to simulation using FDTD method for the comparison with the structure of the Inventive Example 1. The model of the structure of the Inventive Example 1 was applied for the simulation model. However, the simulation was made under the conditions that the pyramidal protrusion had a width of a bottom face of the pyramidal shape of 50 μm, a pitch of 50 μm and a height "h" of 30 to 300 μm to obtain the transmittance.

As a result, the peak transmittance was proved to be 80 percent at the same height "h" of 75 μm as the Inventive Example 1 (at a frequency of 0.75 THz). In this case, it was proved to be necessary to increase the height "h" to more than 100 μm for attaining a peak transmittance of 90 percent or more. It is thus proved that a high peak transmittance can be obtained even when the depth of the groove is small according to the present invention.

Comparative Example 3

The device main body used in the Inventive Example 1 was applied to measure the transmittance of the electromagnetic wave, except that another sub-wavelength grating structure was formed on the surface of the main body. Here, the thus formed protrusion had a shape of a right rectangular cylinder. The height, pitch and width of the protrusion were 35 μm, 50 μm and 20 μm, respectively.

Further, the structure was produced by pseudo laser ablation method using excimer laser so that shot number of the laser was changed to control the depth and pitch.

As a result, the peak transmittance was proved to be 77 percent (at a frequency of 0.6 THz). According to this structure, the peak transmittance could not exceed 90 percent even when the height "T" was increased in a range of "T" of 30 to 300 μm investigated in this example.

Inventive Examples 2 to 7

In the Inventive Example 1, the height "h" of the protrusion and the radius of curvature of the groove were changed as shown in tables 1 and 2 to measure the peak transmittance. The results were shown in tables 1 and 2.

Comparative Example 4

The peak transmittance of the device was measured as in the Inventive Example 1, except that the grooves were not formed and a flat face is provided instead of the grooves.

According to the results, the peak transmittance was clearly and considerably improved according to the inventive device.

TABLE 1

| Inventive Examples | BA (°) | h μm | WT μm | T μm | WG μm | R μm | Peak Transmittance (%) |
|---|---|---|---|---|---|---|---|
| 1 | 28 | 75 | 37 | 50 | 12.6 | 7.4 | >99 |
| 2 | 28 | 30 | 15 | 28 | 12.6 | 7.4 | 91 |
| 3 | 28 | 40 | 20 | 33 | 12.6 | 7.4 | 93 |
| 4 | 28 | 50 | 25 | 38 | 12.6 | 7.4 | 95 |
| 5 | 28 | 100 | 50 | 62 | 12.6 | 7.4 | >99 |
| 6 | 28 | 50 | 25 | 34 | 8.5 | 5 | 95 |
| 7 | 28 | 75 | 37 | 46 | 8.5 | 5 | >99 |
| 8 | 28 | 100 | 50 | 58 | 8.5 | 5 | >99 |
| 9 | 20 | 50 | 18 | 26 | 8.5 | 5 | 95 |
| 10 | 20 | 75 | 26 | 35 | 8.5 | 5 | >99 |
| 11 | 20 | 100 | 35 | 44 | 8.5 | 5 | >99 |
| 12 | 20 | 50 | 18 | 52 | 34 | 20 | 95 |
| 13 | 20 | 75 | 26 | 61 | 34 | 20 | 97 |
| 14 | 20 | 100 | 35 | 69 | 34 | 20 | >99 |

TABLE 2

| | BA (°) | h μm | WT μm | T Mm | WG μm | R μm | Peak Transmittance (%) |
|---|---|---|---|---|---|---|---|
| Inv. Ex. 15 | 10 | 50 | 8.7 | 17 | 8.5 | 5 | 95 |
| Inv. Ex. 16 | 10 | 75 | 13 | 21 | 8.5 | 5 | >99 |
| Inv. Ex. 17 | 10 | 100 | 17 | 26 | 8.5 | 5 | >99 |
| Inv. Ex. 18 | 10 | 300 | 52 | 61 | 8.5 | 5 | >99 |
| Inv. Ex. 19 | 10 | 50 | 8.7 | 26 | 17 | 10 | 95 |
| Inv. Ex. 20 | 10 | 75 | 13 | 30 | 17 | 10 | 97 |
| Inv. Ex. 21 | 10 | 100 | 17 | 35 | 17 | 10 | >99 |
| Inv. Ex. 22 | 10 | 300 | 52 | 70 | 17 | 10 | >99 |
| Inv. Ex. 23 | 10 | 50 | 8.7 | 43 | 34 | 20 | 92 |
| Inv. Ex. 24 | 10 | 75 | 13 | 47 | 34 | 20 | 95 |
| Inv. Ex. 25 | 10 | 100 | 17 | 52 | 34 | 20 | 97 |
| Com. Ex. 1 | None | None | None | None | None | None | 55 |
| Com. Ex. 2 | 72 | 75 | 50 | 50 | 0 No groove | No groove | 80 |
| Com. Ex. 4 | 28 | 75 | 37 | 50 | 12.6 | Flat Face | 80 |

Although the present invention has been described with reference to particular embodiments, the invention is not limited thereto and various changes and modification may be made without departing from the scope of the appended claims.

The invention claimed is:

1. A device comprising a non-linear optical crystal, said device oscillating an electromagnetic wave having a target frequency of 0.1 THz to 30 THz from said crystal to outside of said crystal:

said device comprising a main body comprising said non-linear optical crystal and a sub-wavelength grating structure formed on said main body;

wherein said sub-wavelength grating structure comprises protrusions periodically arranged in first and second directions on said main body, respectively, first grooves each provided between said adjacent protrusions and extending in said first direction, and second grooves each provided between said adjacent protrusions and extending in said second direction, wherein each of said protrusions comprises an upper end, a pair of first faces opposing in said first direction with each other, and a pair of second faces opposing in said second direction with each other, wherein a width of said first face is made smaller from said main body toward said upper end of said protrusion, a width of said second face is made smaller from said main body toward said upper end of said protrusion, said first groove forms a curved profile in a cross section cut along a direction of width of said first groove, and said second groove forms a curved profile in a cross section cut along a direction of width of said second groove.

2. The device of claim 1, wherein said first faces and said second faces of each of said protrusions are flat.

3. The device of claim 1, wherein said first faces and said second faces of each of said protrusions are concave faces.

4. The device of claim 1, wherein said first and second directions are intersected at a right angle.

5. The device of claim 4, wherein each of said protrusions is of a pyramidal shape.

6. The device of claim 1, wherein said upper end of each of said protrusions is flat.

\* \* \* \* \*